(12) United States Patent
Jin

(10) Patent No.: US 8,349,710 B2
(45) Date of Patent: Jan. 8, 2013

(54) SHIELDING TECHNIQUES FOR AN INTEGRATED CIRCUIT

(75) Inventor: Yonggang Jin, Singapore (SG)

(73) Assignee: STMicroelectronics Asia Pacific Pte. Ltd., Singapore (SG)

( * ) Notice: Subject to any disclaimer, the term of this patent is extended or adjusted under 35 U.S.C. 154(b) by 0 days.

(21) Appl. No.: 12/911,171

(22) Filed: Oct. 25, 2010

(65) Prior Publication Data

US 2012/0098104 A1   Apr. 26, 2012

(51) Int. Cl.
*H01L 23/544* (2006.01)
*H01L 21/78* (2006.01)
*H01L 21/302* (2006.01)

(52) U.S. Cl. . 438/460; 257/659; 257/660; 257/E23.114; 438/462

(58) Field of Classification Search .................. 257/659, 257/660, E23.114; 438/460, 462
See application file for complete search history.

(56) References Cited

U.S. PATENT DOCUMENTS

| 7,452,743 B2 | 11/2008 | Oliver et al. | |
|---|---|---|---|
| 7,989,928 B2 | 8/2011 | Liao et al. | |
| 2003/0104679 A1* | 6/2003 | Dias et al. | 438/462 |
| 2003/0218257 A1* | 11/2003 | Ishio et al. | 257/781 |
| 2004/0178500 A1 | 9/2004 | Usui | |
| 2006/0038245 A1* | 2/2006 | Terui | 257/421 |

* cited by examiner

*Primary Examiner* — Eugene Lee
*Assistant Examiner* — Peniel M Gumedzoe
(74) *Attorney, Agent, or Firm* — Wolf, Greenfield & Sacks, P.C.

(57) ABSTRACT

Described herein are techniques for forming, during wafer processing, a conductive shielding layer for a chip formed from a wafer. The conductive shielding layer can be formed on multiple sides of a chip prior to dicing the wafer to separate the chip from the wafer. A wafer may be processed to form trenches that extend substantially through the wafer. The trenches may be formed opposite scribe lines that identify boundaries between chips of the wafer and may extend through the wafer toward the scribe lines. A shielding layer may be formed along the trenches.

11 Claims, 4 Drawing Sheets

SHIELDING TECHNIQUES FOR AN INTEGRATED CIRCUIT

BACKGROUND

1. Technical Field

Embodiments relate to forming shielding layers for integrated circuit. More particularly, some embodiments relate to a manufacturing process for forming an integrated circuit in which a shielding layer is formed on multiple sides of the integrated circuit during wafer processing, prior to dicing the wafer.

2. Discussion of Related Art

Conventional manufacturing processes for integrated circuits typically include both wafer processing and a packaging process. During wafer processing, a wafer is formed and processed in various ways. By dicing the wafer, regions of the wafer can separated into individual chips. Dicing the wafer is the last step of the wafer processing, as following the dicing the chips are no longer part of a wafer.

After dicing the wafer, each chip may be packaged during a packaging process. The packaging process involves covering the chip with one or more packaging layers that protect the chip. One of the packaging layers may be a shielding layer that covers the components of the chip. This shielding layer typically is made of a conductive material and shields the chip from external electromagnetic fields, to reduce the effects of the external electromagnetic fields on components or operations of the chip.

In these conventional processes, the shielding layer is formed in two steps. First, during the wafer processing, a shielding layer is deposited on one side of the wafer. Second, after the wafer processing and during the packaging process of an individual chip separated from the wafer, a shielding layer is created on the other sides of the chip such that the shielding layer surrounds the chip. The shielding layer is created by spraying the conductive material onto the chip.

SUMMARY

In one embodiment, there is provided a method of forming at least one conductive shielding layer for an integrated circuit. The integrated circuit is formed from a region of a wafer. The method comprises forming the at least one conductive shielding layer on at least three sides of the region prior to separating the integrated circuit from the wafer.

In another embodiment, there is provided a method for processing a wafer including a region corresponding to a chip to be formed from the wafer. The method comprises forming, adjacent to the region, a trench in the wafer extending through a majority of a thickness of the wafer, and forming a conductive shielding layer for the integrated circuit along a side of the trench. The method further comprises, after forming the shielding layer, cutting through the trench to separate the chip from the wafer.

In a further embodiment, there is provided a wafer comprising a plurality of regions where each region corresponds to an integrated circuit to be formed from the wafer. The wafer comprises a conductive layer connected to a first region and a second region of the plurality of regions and exposed on a first side of the wafer. The conductive layer marks a boundary between the first region and the second region. The wafer further comprises at least one trench, adjacent to each of the first region and the second region, extending from a second side of the wafer opposite the first side and extending substantially through the wafer toward the conductive layer. The wafer further comprises a conductive shielding layer formed on the second side and along sides of the trench.

The foregoing is a non-limiting summary of the invention, which is defined by the attached claims.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

As discussed above, conventional processes for forming a shielding layer include spraying metal shielding layers on the chip after the chip has been diced from the wafer, which allows for forming the shielding layer on multiple sides of the chip. Forming a shielding layer during packaging can be time consuming and expensive.

Described herein are techniques for forming a shielding layer on multiple sides of a chip during wafer processing. Depositing a shielding layer on multiple sides of the chip during a wafer process can be more cost effective than forming the shielding layer during a packaging process. In some embodiments, trenches are formed in a wafer along scribe lines between integrated circuits to be formed from the wafer. A shielding layer can be formed along the sides of the trenches between the integrated circuits. Thus, when the chips are diced from the wafer the sides of the chips can have shielding material formed thereon prior to the packaging process. In some embodiments, a shielding layer can be formed on all sides of the chip prior to the packaging process.

Figure 1A:
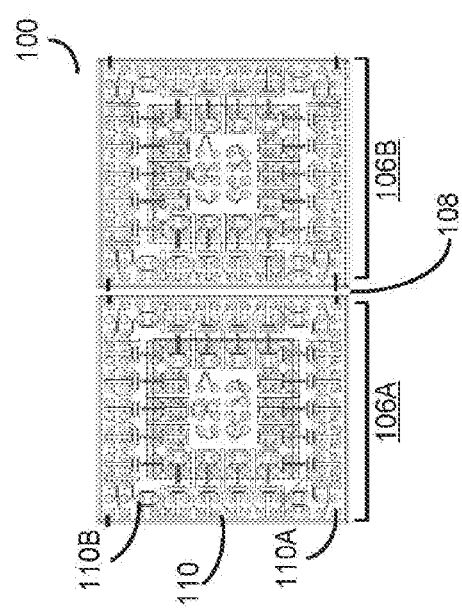
FIGS. 1A and 1B show an example of a wafer that may be processed according to some of the techniques described herein.
Figure 1B:
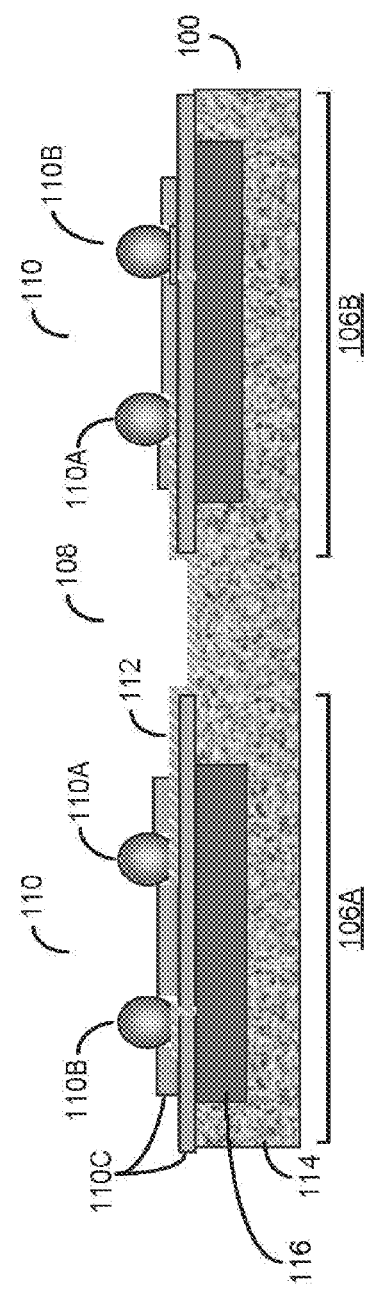

FIGS. 1A and 1B illustrate an exemplary wafer that may be shielded during wafer processing, according to some embodiments. FIGS. 1A and 1B illustrate a wafer 100 from two angles. FIG. 1A shows a top view from the side of wafer 100 having an interface 110 comprising at least one ball connection. FIG. 1B shows a side view along a cross-section of the wafer 100. The wafer 100 includes two regions 106A, 106B each corresponding to a chip to be formed from the wafer when the regions 106A, 106B are separated from the wafer. A scribe line 108 is formed in the wafer 100 as a mark indicating the boundary between the regions 106A, 106B. While only two regions 106A, 106B are illustrated in FIGS. 1A and 1B, a wafer may include any number of regions and any number of chips. Scribe lines may mark the boundaries of each chip to be formed from the wafer 100. Scribe lines such as scribe line 108 may be formed using any suitable technique for forming a groove in a wafer, including by removing material from a wafer or by applying layers to the wafer without forming layers on the scribe line. For example, in some embodiments the scribe line 108 may be formed by cutting the wafer 100 and in other embodiments the scribe line 108 may be created by forming a gap between layers of the wafer 100 when the layers are formed.

The scribe line 108 may be a groove formed in the wafer between regions to indicate the boundary between the regions. As shown in FIG. 1B, the groove of the scribe line 108 extends into the wafer such that the scribe line 108 has side walls and a base. The scribe line 108 may have any suitable dimensions, such as any suitable depth along the walls and any suitable width along the base. As the scribe line 108 extends into the wafer, a base of the scribe line 108 may be a layer of the wafer 100. The base may be a conductive layer such as a metal layer that is a pure metal or a metal alloy (e.g., combinations of metals and/or non-metals). The conductive layer that forms the base of the scribe line 108, in some cases, may be the same as another layer of the circuit, including routing layer 112 discussed below.

In the wafer of FIGS. 1A and 1B, each region 106A, 106B may include an interface 110 having ball connections. The interface 110 can be implemented in any suitable manner, including as a fan-in or fan-out wafer level package (WLP) or as a ball-grid array (BGA). The ball connections may be formed in any suitable manner, including as solder balls. The ball connections include balls 110A that are designed to be grounded and balls 110B that are designed to convey input/output signals. The balls 110A can also be electrically connected to a shielding layer such that the balls 110A sink electrical current induced in the shielding layer. The balls 110B may carry signals, including power signals or information signals, to components of an integrated circuit. In this example, balls 110A to be grounded are formed at corners of the interface 110A and the balls 110B to convey input/output signals are formed at the sides and interior of the interface 110. However, the balls may be formed in any suitable position on the integrated circuit. The interface 110 may also include layers 110C of a dielectric polymeric material that acts as an insulator and protector between the ball connections and between the a chip that will be formed a region 106A and a surface on which the interface 110 will be placed.

A routing layer 112 may also be included in each region 106A, 106B that electrically contacts at least some balls of the interface 110 to carry electrical signals to and from the balls. The routing layer 112 may electrically contact the balls 110A that are grounded, for example. The routing layer 112 may also, in some embodiments, form a base of the scribe line 108 or may, in other embodiments, be electrically connected to a conductive layer forming the base of the scribe line 108. In this way, the conductive layer of the scribe line 108, the routing layer 112, and the balls 110A that are grounded may be electrically connected to one another.

The routing layer 112 can be formed of any suitable conductive material. Metals, such as pure metals and metal alloys (e.g., combinations of metals and/or non-metals) may be used to form the routing layer 112. The routing layer 112 may have any suitable geometry, such as a sheet formed over a surface of the wafer 100 or as discrete signal lines on the surface of the wafer 100.

Each region 106A, 106B is formed in substrate 114 and may include least one functional area 116. The functional area(s) 116 include semiconductor components and may include multiple layers of semiconductor material, conductive material, insulating material, etc. that are arranged to perform some function. For example, a functional area 116 may include a transistor. Wafer 100 may include multiple regions 106A, 106B that can each form a same type of integrated circuit or different types of integrated circuits. The wafer 100 illustrated in FIGS. 1A and 1B may have been formed using any suitable techniques for creating a wafer during a wafer process, including known techniques.

In some embodiments, a complete shielding layer covering a chip can be formed for an integrated circuit during wafer processing prior to a packaging process. A shielding layer can be formed on the sides of the chips before the wafer is diced to separate chips. Some exemplary techniques for forming a shielding layer during wafer processing will now be described.

Figure 2A:
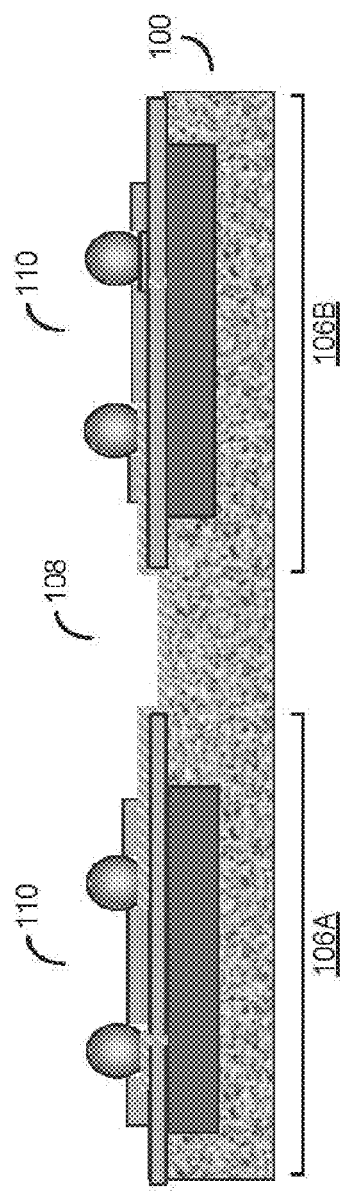
FIGS. 2A-2E show steps for forming a shielding layer during wafer processing, according to some embodiments.

FIGS. 2A-2E illustrate steps of an exemplary process for forming a shielding layer during wafer processing, prior to dicing the wafer. FIG. 2A shows an exemplary wafer 100 that may be shielded using this example. Where elements of the wafer 100 of FIG. 2A are similar to elements of the wafer 100 of FIGS. 1A and 1B, the same reference characters have been used. During the wafer processing, a first shielding layer may be formed on a surface of the wafer 100. This first shielding layer may be formed on a surface of the wafer having the interface 110. The first shielding layer may be formed prior to formation of an interface 110 or at any other suitable time. The first shielding layer may be formed between the functional layer 116 of a region 106A, 106B and the interface 110, such that the first shielding layer may be considered to be under the interface 110. The first shielding layer may be formed so that the shielding layer electrically contacts the balls of the interface 110 that are grounded, such that electric currents that are induced in the first shielding layer by electromagnetic fields external to the chip may be sunk through a ground connection of the interface 110. In some embodiments, forming the first shielding layer may be done as part of forming the routing layer 112. In some cases, the first shielding layer may be the same layer as the routing layer 112. In other embodiments, though, the first shielding layer may be different from the routing layer 112 and may be electrically connected to the routing layer 112.

Figure 2B:
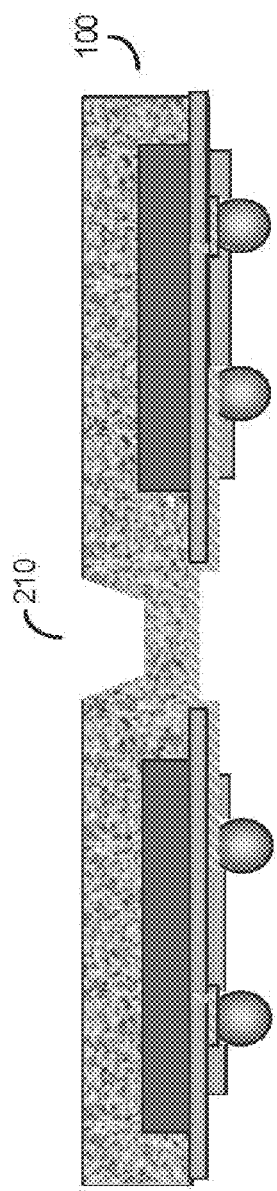
Figure 2C:
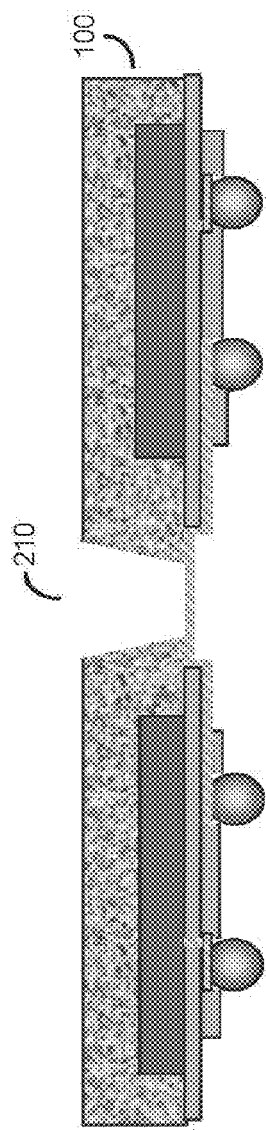

Next, as is illustrated in FIGS. 2B and 2C, a trench 210 is formed in the wafer 100. The trench 210 extends from a side of the wafer 200 opposite to the interface 110 to a conductive layer of the scribe line 108. The trench 210 may be formed in any suitable manner, as embodiments are not limited in this respect. In this example, three steps are taken to form the trench.

In the first step (as illustrated in FIG. 2B), the wafer 100 is partially scored along the scribe line 108. In the first scoring, the wafer 100 is scored on a side opposite to a side having the scribe line 108. In some embodiments, the partial scoring may include forming a notch through a substantial portion of the thickness of the wafer 100, including more than half-way through the wafer 100, nearly all the way through the wafer 100, or through all layers of the wafer 100 other than the routing layer 112 forming the base of the scribe line 108. A depth of the trench resulting from the first scoring may vary between embodiments, depending on the precision of equipment with which the scoring is carried out. Embodiments are not limited to performing the first scoring in any particular manner. In some embodiments, a mechanical cutting may be performed using known mechanical methods for cutting a wafer along a scribe line. When such conventional methods are used, any suitable technique may be used to prevent the cutting from extending all the way through the wafer 100, such as by manually stopping the cutting at a certain point, by controlling the cutting to be performed for only a predetermined distance through the wafer, or by configuring equipment performing the cutting to stop cutting upon sensing that the routing layer 112 has been reached.

In this embodiment, a second scoring is carried out after the first scoring. In the second scoring (illustrated in FIG. 2C), the wafer 100 is again partially scored along the trench 210 that was formed by the first scoring. Additional material is removed from the wafer 100 by the second scoring along the trench 210. When the additional material is removed, the trench 210 may extend from one side of the wafer 100 all the way to the base of the scribe line 108, which may be the routing layer 112 as discussed above. The second scoring may be performed in any suitable manner, as embodiments are not limited in this respect. In some embodiments, the second scoring may be performed by grooving the wafer 100 using a laser. In some embodiments that perform grooving, the grooving may be performed using a low-power laser that will remove layers of the wafer 100 without removing the conductive material of the base of the scribe line 108 (e.g., the routing layer 112).

As discussed above, in embodiments a shielding layer is created for an integrated circuit during the wafer processing, prior to dicing the wafer. In the embodiment illustrated in FIGS. 2A-2E, at least part of this shielding layer is formed along edges of the trench 210 formed in the wafer 100. In particular, the shielding layer may be deposited in the trench 210 so as to electrically contact the conductive layer at the base of the trench 210, which in the example of FIGS. 2A-2E is the routing layer 112. Because the shielding layer will electrically contact the routing layer 112, in some embodiments, once the trench 210 is formed in the wafer 100, the trench 210 is cleaned during a cleaning process. The cleaning process may be any suitable cleaning process that cleans in any suitable manner. In some cases, the cleaning process may be carried out to ensure that a good seal may be created between the deposited shielding layer and the borders of the trench 210 and that a good electrical connection between the deposited shielding layer and the routing layer 112. For example, a plasma etch may be carried out to remove oxide from the trench 210, including from the edges of the trench 210 and from the routing layer 112. Such a plasma etch may be carried out using argon or any other suitable etchant.

It should be appreciated that while, for ease of illustration, FIGS. 2B-2C illustrate only one trench 210 being formed, in cases where a wafer 100 includes more than two regions 106A, 106B, more trenches may be formed. In some embodiments, a trench is formed between all adjacent regions of the wafer 100 so as to form a grid of trenches in the wafer. These trenches 210 score the wafer 100 such that each region 106A, 106B is separated from each of the other regions.

As discussed above, in some embodiments the scribe line 108 may be a groove formed on one side of the wafer 100 that exposes, at a base of the scribe line 108, the routing layer 112. Additionally, in these embodiments, the trench(es) 210 extend from a second side of the wafer, directly opposite the scribe line 108 and to the routing layer 112. Accordingly, in these embodiments, following formation of the trench(es) 210, each region may be connected to other regions of the wafer by only the routing layer 112. As discussed above, the routing layer 112 may be electrically connected to a first shielding layer formed in the wafer or on a surface of the wafer, that forms a part of a shielding layer for chips formed from the wafer or may be the same layer as the first shielding layer. Accordingly, the routing layer 112 that is connected to at least a part of the first shielding layer is exposed to the surface of the wafer.

In this embodiment, the first shielding layer of the wafer 100 does not surround the wafer and is formed on only one side of the wafer 100, which is only one side of a chip to be formed from the wafer 100. However, a conductive shielding layer for preventing external electromagnetic fields from influencing operations of the chip operates well when the conductive shielding layer surrounds or substantially surrounds the chip.

In embodiments operating according to techniques described herein, a shielding layer for a chip is formed on multiple sides of the chip during wafer processing, prior to dicing the wafer. In the embodiment illustrated in FIGS. 2A-2E, the shielding layer is formed on multiple sides by taking advantage of the trench 210 that exposes the routing layer 112 that is electrically connected to the first shielding layer. More particularly, by depositing additional conductive shielding layers on the chip opposite the side having the first shielding layer on the side with the trench, other sides of the chip can be shielded with the conductive shielding layer. Additionally, because the routing layer 112 is exposed during this forming, the additional conductive shielding layers can be formed in a way that electrically connects the conductive shielding layers to the routing layer 112 and thereby to the first shielding layer. The additional conductive shielding layers can therefore be electrically connected to the first shielding layer to form a shielding layer on multiple sides of a chip to be formed from the wafer 100.

Figure 2D:
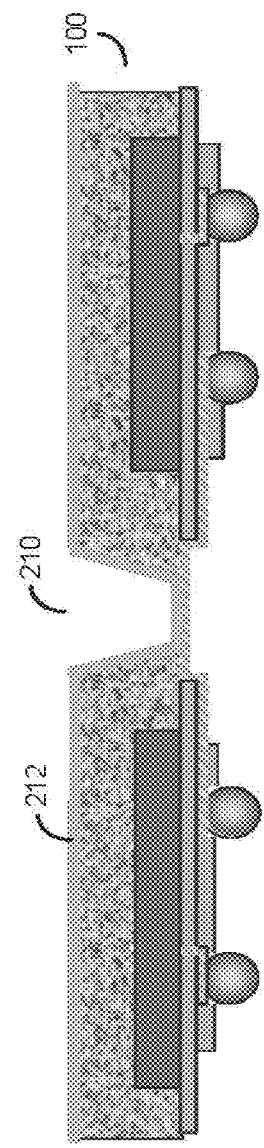

Accordingly, as shown in FIG. 2D, a shielding layer 212 can be deposited on one side of the wafer 100 that coats a side of the wafer 100 and sides of the trench 210. In some embodiments, the sides of the trench 210 may also be the sides of a chip to be formed from a region 106A, 106B of the wafer 100. Accordingly, when the shielding layer 212 is deposited, the shielding layer 212 may be formed on multiple sides of a chip, including the top of the chip and the sides of the chip. Thus, between the first shielding layer discussed above and the shielding layer 212, a shielding layer may be formed on multiple sides of a chip during wafer processing. For example, the shielding layer may be formed on at least three sides of a chip or may completely surround the chip.

The shielding layer can reduce the effects of external electromagnetic fields on components and operations of a chip. Any suitable layer may be used for this purpose. For example, the shielding layer 212 can be composed of conductive materials for forming a conductive layer on the wafer 100. Suitable conductive materials include metals, such as pure metals and metal alloys (e.g., combinations of metals and/or non-metals). In some cases, the conductive layer may be a silver layer. Additionally, the shielding layer 212 can be formed in any suitable manner, including using known techniques for forming layers on wafers. For example, a depositing process such as a sputtering process may be used.

The shielding layer 212 is formed during wafer processing. By forming the shielding layer 212 during the wafer processing, when the wafer 100 is diced to separate regions 106A, 106B from the wafer 100 so as to form chips, a chip has already been provided with a shielding layer. Additionally, in some embodiments, by forming the shielding layer 212 during wafer processing, the same equipment or the same facility as was used for forming layers of the wafer may be used for forming the shielding layer 212. Using the same equipment or facility may reduce a complexity or cost of the forming a shielding layer.

Figure 2E:
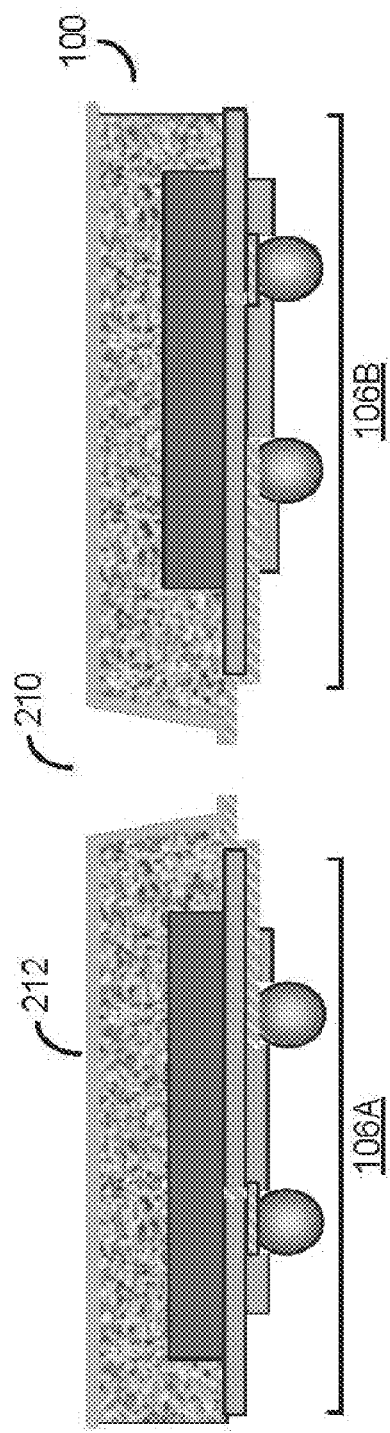

After the shielding layer 212 is formed, a dicing is performed on the wafer 100, as shown in FIG. 2E. The dicing is performed to separate the regions 106A, 106B from one another and from the wafer 100, such that individual chips are created. The dicing is performed by further reducing a thickness of the wafer 100 at the site of the trench(es) 210, such that remaining layers of the wafer 100 are eliminated and a gap is formed between the regions 106A, 106B. For example, the routing layer 112 and the shielding layer 112 at the base of the trench 210 may be removed during the dicing. The dicing may be performed in any suitable manner, including according to known techniques for dicing wafers along scribe lines. For example, a mechanical dicing process may be used.

Following the wafer processing, a packaging process may be carried out on the chips formed from the regions 106A, 106B of the wafer 100. Other processes may also be carried out following the wafer processing, including any known processes for processing integrated circuits formed from a wafer.

In this particular embodiment, a complete shielding layer is formed on all sides of a chip. Embodiments are not, however, limited to forming a complete shielding layer during the wafer processing. In some embodiments, a partial shielding layer may be formed during the wafer processing that covers only some sides of the chip. For example, in one embodiment, during a wafer processing a shielding layer may be deposited along a top and bottom of a chip and along one side of the chip along the border of a trench. In other embodiments, a shielding layer may be deposited on more sides of the chip including, as discussed above, all sides of the chip. A shielding layer may be deposited on any suitable sides of a chip.

In some embodiments, forming a shielding layer on multiple sides of a chip during wafer processing may include forming a shielding layer on the "five sides" of the chip during wafer processing. Integrated circuits can be thought of, in a simplified form, as a rectangular prism or a cube having six sides (e.g., the "top," "bottom," "front," "back," "left," and "right"). An integrated circuit may have an irregular form, with notches or protrusions, such that the integrated circuit has more than six sides, but may still be considered simply to have six sides. With respect to the six sides, the sides other than the top are commonly referred to as the "five sides." The top side is a side that is configured to join to a surface when the integrated circuit is in use. For example, the top side may have an interface (e.g., a fan-out wafer-level package) formed thereon. The "five sides" are thus the sides not joined to the surface and visible when the integrated circuit is in use. In the embodiment illustrated in FIGS. 2A-2E, with respect to region 106A the top side is the side having the interface 110 and the five sides are the other side of the wafer 100 and the sides of the trenches 210 surrounding the region 106A.

In some conventional techniques, a shielding layer could be formed on the top side during wafer processing, but not on the "five sides." This was because, while an integrated circuit to be shielded is still a part of the wafer (before the dicing), there is limited access to the lateral sides of the chip (e.g., the "front," "back," "left," and "right"), as those sides were internal to the wafer. Thus, in these conventional processes, shielding layers were formed on the five sides during a packaging process.

In some embodiments operating according to techniques described herein, a shielding layer can be formed on the "five sides" during a wafer processing. When trenches like the trench 210 are formed in a wafer, sides of the trenches correspond to sides of chips to be formed from the wafer. By depositing a conductive shielding layer on a side of the wafer and the sides of the trenches, as illustrated in FIG. 2D, a shielding layer can be formed on the "five sides."

It should be appreciated that embodiments may operate with any suitable wafer formed using any suitable wafer process, as embodiments are not limited to operating with any particular wafer or any particular wafer processing. Embodiments are therefore not limited to operating with any of the exemplary wafers described above, as others are possible. Wafer processing, as used herein, may include suitable processing of a wafer that is used to form one or more integrated circuits or structures, and may include forming one or more layers of the wafer, dicing the wafer to separate regions of the wafer to form different chips, and any processing steps in between. The wafer processing may include depositing and/or removing one or more semiconductor and/or conductive layers to form an integrated circuit and may include forming one or more semiconductor components in the wafer.

Various aspects of the embodiments described above may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

Having thus described several aspects of at least one embodiment, it is to be appreciated that various alterations, modifications, and improvements will readily occur to those skilled in the art. Such alterations, modifications, and improvements are intended to be part of this disclosure, and are intended to be within the spirit and scope of the principles described herein. Accordingly, the foregoing description and drawings are by way of example only.

What is claimed is:

1. A method of forming at least one conductive shielding layer for an integrated circuit, the integrated circuit to be formed from a first region of a wafer, the wafer comprising a second region from which a second integrated circuit is to be formed and a boundary region between the first region and the second region, the method comprising:
    forming the at least one conductive shielding layer on at least three sides of the first region while the first region is a part of the wafer, the forming comprising:
        forming a second conductive layer on a first surface of the wafer, the second conductive layer extending between the first region and the second region across the boundary region, the second conductive layer forming a portion of the at least one conductive shielding layer on a first side of the first region;
        forming a trench in the boundary region, the trench extending from a second surface of the wafer opposite the first surface of the wafer and through the wafer, wherein the second conductive layer extends between the first region and the second region across the boundary region following formation of the trench; and
        forming a third conductive layer on the second surface of the wafer, the third conductive layer forming a portion of the at least one conductive shielding layer on at least a second side and a third side of the first region.

2. The method of claim 1, wherein forming the at least one conductive shielding layer comprises forming the at least one conductive shielding layer on at least five sides of the first region prior to separating the integrated circuit from the wafer.

3. The method of claim 1, further comprising:
    dicing the wafer to separate the integrated circuit from the wafer.

4. The method of claim 1, wherein forming the trench comprises forming the trench extending through a majority of the wafer.

5. The method of claim 1, wherein, during the forming of the trench, the second conductive layer is exposed on the first surface of the wafer.

6. The method of claim 1, further comprising:
after forming the third conductive layer, separating the first region from the wafer at the trench.

7. The method of claim 6, wherein separating the first region from the wafer comprises cutting a remainder of the wafer along the trench, wherein cutting the remainder of the wafer comprises cutting the second conductive layer.

8. The method of claim 1, wherein forming the trench comprises forming the trench surrounding the first region.

9. A method for processing a wafer, the wafer including a region corresponding to a chip to be formed from the wafer, the method comprising:
forming, adjacent to the region, a trench in the wafer extending through a majority of a thickness of the wafer;
forming a conductive shielding layer for the integrated circuit along a side of the trench; and
after forming the shielding layer, cutting through the trench to separate the chip from the wafer,
wherein the wafer includes on a first side a scribe line marking edges of the region, the scribe line comprising a conductive layer, and
wherein forming the trench comprises forming the trench on a second side of the wafer, opposite from the first side, extending substantially through the wafer to the conductive layer.

10. The method of claim 1, wherein forming the third conductive layer comprises forming the third conductive layer with at least a portion of the third conductive layer that is formed in the trench contacting the second conductive layer.

11. The method of claim 1, wherein forming the trench through the wafer comprises forming the trench through the wafer to the second conductive layer, wherein at least a portion of the second conductive layer is exposed on the second surface of the wafer following the forming of the trench.

* * * * *

UNITED STATES PATENT AND TRADEMARK OFFICE
CERTIFICATE OF CORRECTION

PATENT NO.        : 8,349,710 B2                                Page 1 of 1
APPLICATION NO.   : 12/911171
DATED             : January 8, 2013
INVENTOR(S)       : Yonggang Jin It is certified that error appears in the above-identified patent and that said Letters Patent is hereby corrected as shown below:

On the Title Page, Item (73) should read:
    (73) Assignee: STMicroelectronics PTE. LTD.

Signed and Sealed this
Twenty-first Day of April, 2015

Michelle K. Lee
*Director of the United States Patent and Trademark Office*